(12) United States Patent
Nikitin et al.

(10) Patent No.: US 8,455,812 B2
(45) Date of Patent: Jun. 4, 2013

(54) GAMMA RAY DETECTORS HAVING AZIMUTHAL SENSITIVITY

(75) Inventors: Anton Nikitin, Houston, TX (US); Alexandr A. Vinokurov, Novosibirsk (RU); Richard R. Pemper, Sugar Land, TX (US)

(73) Assignee: Baker Hughes Incorporated, Houston, TX (US)

( * ) Notice: Subject to any disclaimer, the term of this patent is extended or adjusted under 35 U.S.C. 154(b) by 250 days.

(21) Appl. No.: 12/846,989

(22) Filed: Jul. 30, 2010

(65) Prior Publication Data

US 2011/0029246 A1 Feb. 3, 2011

Related U.S. Application Data

(60) Provisional application No. 61/229,888, filed on Jul. 30, 2009.

(51) Int. Cl.
*G01V 5/04* (2006.01)
*G06F 19/00* (2011.01)
*H01L 31/18* (2006.01)

(52) U.S. Cl.
USPC .......................................... 250/256; 250/261

(58) Field of Classification Search
USPC ....................................................... 250/256
See application file for complete search history.

(56) References Cited

U.S. PATENT DOCUMENTS

| 4,228,350 | A | * | 10/1980 | Paap et al. ...................... 250/267 |
| 4,415,808 | A | | 11/1983 | Cusano et al. |
| 4,587,423 | A | | 5/1986 | Boyce |
| 4,823,016 | A | | 4/1989 | Yamashita et al. |
| 5,021,652 | A | * | 6/1991 | Arnold ........................... 250/267 |
| 5,205,167 | A | * | 4/1993 | Gartner et al. .............. 73/152.14 |
| 6,173,793 | B1 | * | 1/2001 | Thompson et al. ............. 175/45 |
| 2002/0153481 | A1 | * | 10/2002 | Stoller et al. ................... 250/266 |
| 2003/0080743 | A1 | * | 5/2003 | Das et al. ........................ 324/338 |
| 2006/0192096 | A1 | | 8/2006 | Radtke et al. |

OTHER PUBLICATIONS

Notification of Transmittal of the International Search Report and the Written Opinion of the International Searching Authority, or the Declaration; PCT/US2010/043491; Mar. 3, 2011.
Weatherford "HEL MWD System-High-Temperature Azimuthal Gamma Ray (HAGR) Sensor". Weatherford International LTD. www.weatherford.com. 2006-2007. 3 pages.

* cited by examiner

*Primary Examiner* — Marcus Taningco
(74) *Attorney, Agent, or Firm* — Cantor Colburn LLP

(57) ABSTRACT

An instrument for performing measurements downhole includes: at least one gamma-ray detector with azimuthal sensitivity equipped for discriminating energy of incident gamma-rays. This instrument is equipped with or without a neutron or gamma-ray source. A method and computer program product providing the azimuthal sensitivity of the instrument is provided.

15 Claims, 10 Drawing Sheets

FIG. 5A
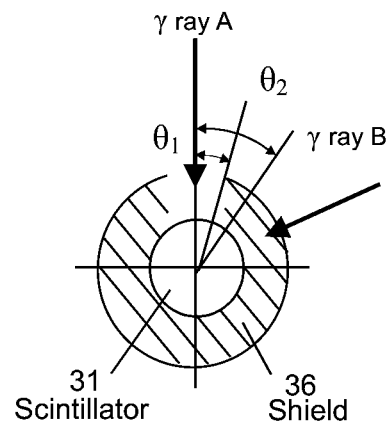
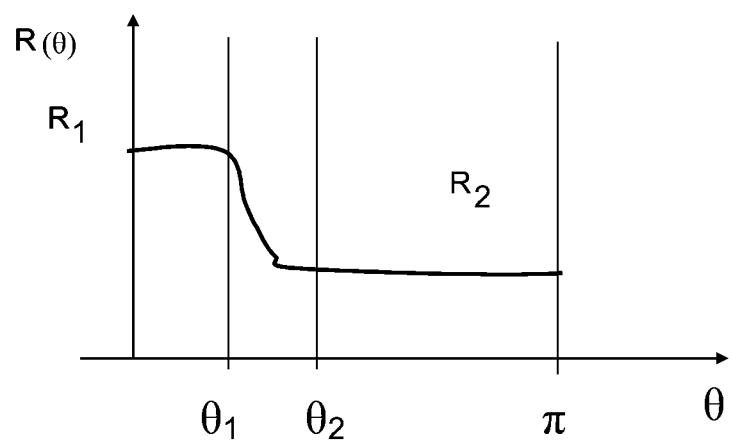

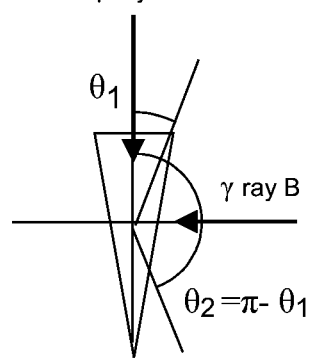
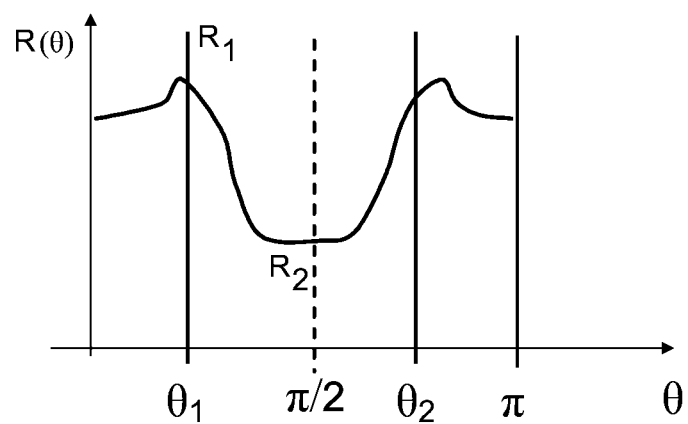
FIG. 5B

FIG. 5C
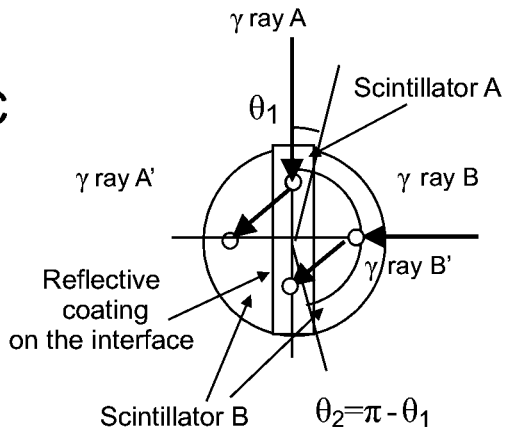
○ point of γ ray interaction with scintillator
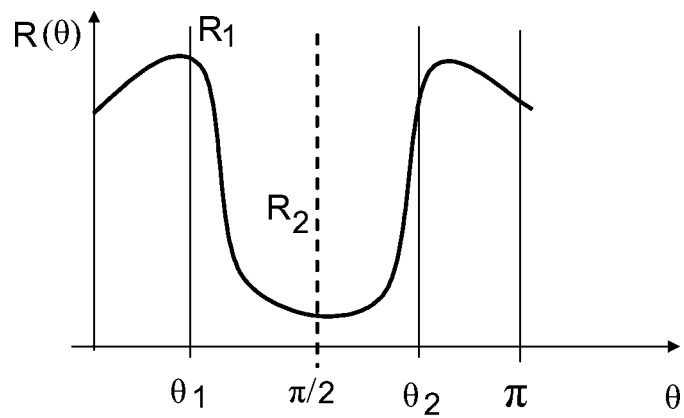

$$I_{ph} = I_0 \int_0^{2\pi} \exp(-x(\theta)/L_\gamma)\,d\theta$$

GAMMA RAY DETECTORS HAVING AZIMUTHAL SENSITIVITY

CROSS-REFERENCE TO RELATED APPLICATIONS AND PRIORITY CLAIM

This application claims the benefit of U.S. Provisional Application Ser. No. 61/229,888, entitled "GAMMA RAY DETECTORS HAVING AZIMUTHAL SENSITIVITY", filed Jul. 30, 2009, under 35 U.S.C. §119(e), which is incorporated herein by reference in its entirety.

BACKGROUND OF THE INVENTION

1. Field of the Invention

The invention disclosed herein relates to exploration for oil and gas and, in particular, to gamma detectors adapted for a downhole instrument.

2. Description of the Related Art

In the exploration for oil and gas, it is necessary to drill a wellbore into the Earth. While drilling of the wellbore permits individuals and companies to evaluate sub-surface materials and to extract desired hydrocarbons, many problems are encountered.

Consider instrumentation that makes use of radiation detectors. The radiation detectors are typically included in such instruments to evaluate composition of the surrounding sub-surface materials and geologic formations. In some embodiments, radiation sources may be included in the instrument to provide a radiation signal. In other embodiments, the radiation detectors simply monitor background or natural radiation. One exemplary type of radiation detector is a gamma scintillator. Typically, a gamma scintillator is cylindrical and matched to a cylindrical photomultiplier (PMT) tube.

Typical radiation detectors used today, such as the gamma scintillator described above, do not have directional sensitivity. Accordingly, it is difficult for operators to determine directions of interest when a tool is down the wellbore (also referred to as "downhole"). As an accommodation for this, designers have incorporated shielding, which provides a degree of the desired directional sensitivity. Unfortunately, and particularly in the case of instruments using high energy radiation sources, the shielding required can be voluminous and therefore does not make an economic use of space within the instrument.

What are needed are methods and apparatus suited for providing downhole radiation detectors with directional sensitivity. Preferably, the methods and apparatus should provide for reductions or elimination of shielding systems.

BRIEF SUMMARY OF THE INVENTION

In one embodiment, the invention includes a radiation detector for performing measurements downhole in a wellbore, the detector including: a radiation scintillator including a shape that is adapted to provide azimuthal sensitivity relative to the wellbore for detection of radiation downhole.

In another embodiment, the invention includes a method for fabricating a radiation detector for performing a measurement downhole in a wellbore, the detector including: selecting a radiation scintillator material for shaping as a radiation detector; determining an optimal shape of a radiation scintillator that is adapted to provide azimuthal sensitivity relative to the wellbore for detection of radiation downhole; and shaping the material to the optimal shape to provide the azimuthal sensitivity relative to the wellbore for detection of radiation downhole.

In a further embodiment, the invention includes a computer program product stored on computer readable media and including computer executable instructions for evaluating signals from a plurality of radiation detectors, the instructions including instructions for: receiving a plurality of detection events from each scintillator of a radiation detector including a plurality of radiation scintillators, each scintillator including a shape that is adapted for the radiation detector to provide azimuthal sensitivity relative to the wellbore for detection of radiation downhole; at least one of excluding and combining selected ones of the radiation detection events from an output to provide an adjusted output; and providing the adjusted output to a user.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings in which:

FIGS. 5A, 5B and 5C collectively referred to herein as FIG. 5, depict aspects of scintillator crystals with respect to incident gamma rays, and provides associated response curves for each orientation;

FIG. 7A depicts aspects of the noncylindrical gamma-ray detector in a center of the wellbore; while FIG. 7B depicts an associated gamma-ray spectrum measured by the detector;

FIG. 8A depicts a side-wise cross sectional view; while FIG. 8B depicts a top-down cross sectional view;

DETAILED DESCRIPTION OF THE INVENTION

Disclosed herein are various configurations of radiation detection apparatus adapted for use in a downhole environment. The radiation detection apparatus provide users with a high degree of directional sensitivity, such that specific data regarding surrounding materials may be obtained. In order to provide context for the radiation detection apparatus and methods for use, some background information and definitions are provided.

Figure 1:
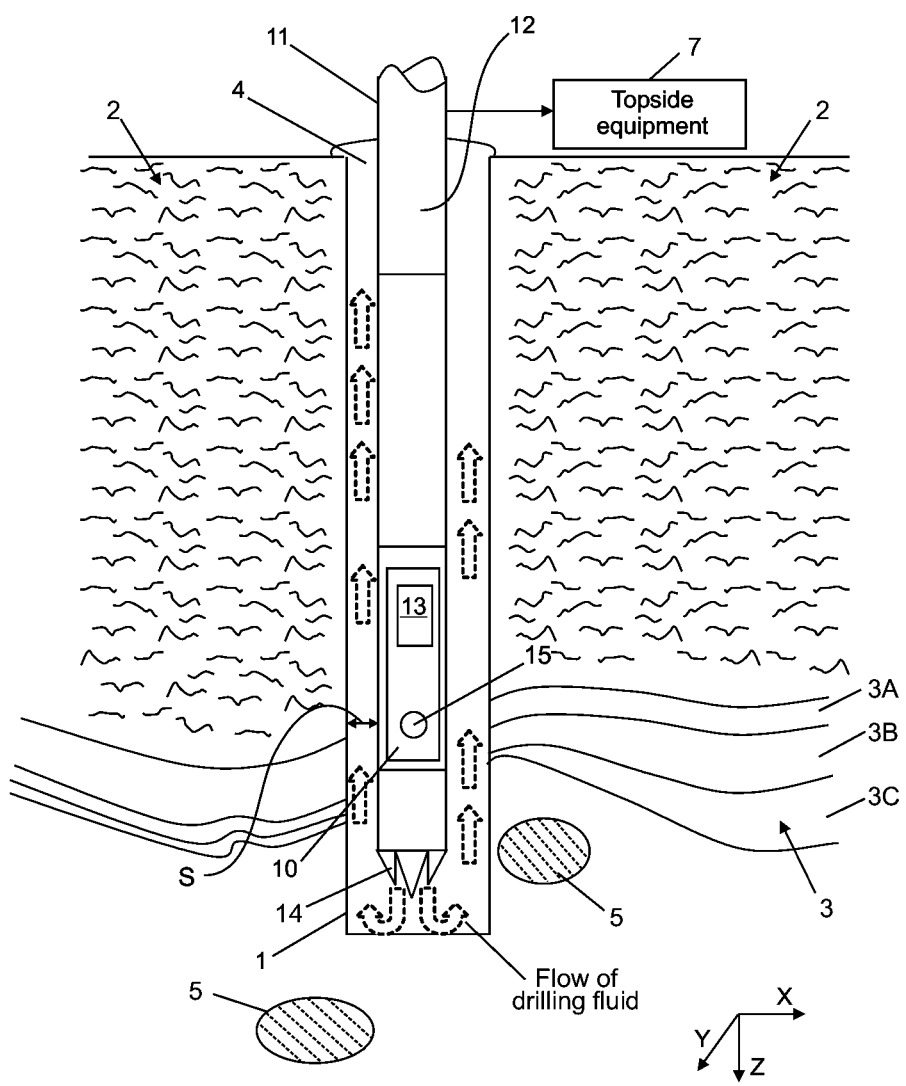
FIG. 1 illustrates an exemplary embodiment of a drill string that includes a logging instrument.

Refer now to FIG. 1 where aspects of an apparatus for drilling a wellbore 1 (also referred to as a "borehole") are shown. As a matter of convention, a depth of the wellbore 1 is described along a Z-axis, while a cross-section is provided on a plane described by an X-axis and a Y-axis.

In this example, the wellbore 1 is drilled into the Earth 2 using a drill string 11 driven by a drilling rig (not shown) which, among other things, provides rotational energy and downward force. The wellbore 1 generally traverses sub-surface materials, which may include various formations 3 (shown as formations 3A, 3B, 3C). One skilled in the art will recognize that the various geologic features as may be encountered in a subsurface environment may be referred to as "formations," and that the array of materials down the borehole (i.e., downhole) may be referred to as "sub-surface materials." That is, the formations 3 are formed of sub-surface materials. Accordingly, as used herein, it should be considered that while the term "formation" generally refers to geologic formations, and "sub-surface material," includes any materials, and may include materials such as solids, fluids, gases, liquids, and the like.

In this example, the drill string 11 includes lengths of drill pipe 12 which drive a drill bit 14. The drill bit 14 also provides a flow of a drilling fluid 4, such as drilling mud. The drilling fluid 4 is often pumped to the drill bit 14 through the drill pipe 12, where the fluid exits into the wellbore 1. This results in an upward flow of drilling fluid 4 within the wellbore 1. The upward flow generally cools the drill string 11 and components thereof, carries away cuttings from the drill bit 14 and prevents blowout of pressurized hydrocarbons 5.

The drilling fluid 4 (also referred to as "drilling mud") generally includes a mixture of liquids such as water, drilling fluid, mud, oil, gases, and formation fluids as may be indigenous to the surroundings. Although drilling fluid 4 may be introduced for drilling operations, use or the presence of the drilling fluid 4 is neither required for nor necessarily excluded from well logging operations. Generally, a layer of materials will exist between an outer surface of the drill string 11 and a wall of the wellbore 1. This layer is referred to as a "standoff layer," and includes a thickness, referred to as "standoff, S."

The drill string 11 generally includes equipment for performing "measuring while drilling" (MWD), also referred to as "logging while drilling" (LWD). Performing MWD or LWD generally calls for operation of a logging instrument 10 that in incorporated into the drill string 11 and designed for operation while drilling. Generally, the logging instrument 10 for performing MWD is coupled to an electronics package which is also on board the drill string 11, and therefore referred to as "downhole electronics 13." Generally, the downhole electronics 13 provides for at least one of operational control and data analysis. Often, the logging instrument 10 and the downhole electronics 13 are coupled to topside equipment 7. The topside equipment 7 may be included to further control operations, provide greater analysis capabilities as well as data logging and the like. A communications channel (not shown) may provide for communications to the topside equipment 7, and may operate via pulsed mud, wired pipe, and other technologies as are known in the art.

Generally, data from the MWD apparatus provide users with enhanced capabilities. For example, data made available from MWD evolutions may be useful as inputs to geosteering (i.e., steering the drill string 11 during the drilling process) and the like.

Figure 2:
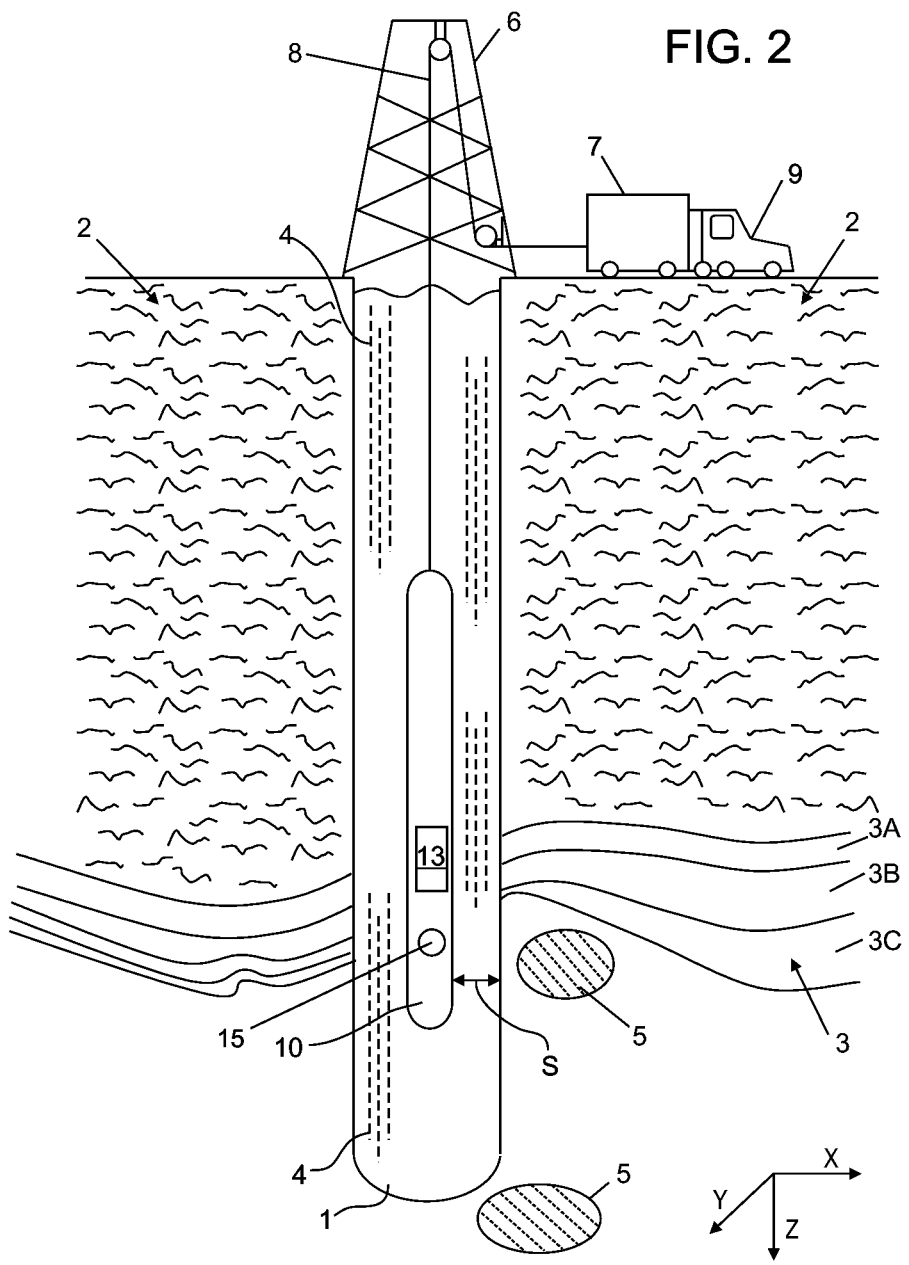
FIG. 2 illustrates an exemplary embodiment for well logging with an instrument deployed by a wireline.

Referring now to FIG. 2, an exemplary logging instrument 10 for wireline logging of the wellbore 1 is shown. As a matter of convention, a depth of the wellbore 1 is described along a Z-axis, while a cross-section is provided on a plane described by an X-axis and a Y-axis. Prior to well logging with the logging instrument 10, the wellbore 1 is drilled into the Earth 2 using a drilling apparatus, such as the one shown in FIG. 1.

In some embodiments, the wellbore 1 has been filled, at least to some extent, with drilling fluid 4. The drilling fluid 4 (also referred to as "drilling mud") generally includes a mixture of liquids such as water, drilling fluid, mud, oil, gases, and formation fluids as may be indigenous to the surroundings. Although drilling fluid 4 may be introduced for drilling operations, use or the presence of the drilling fluid 4 is neither required for nor necessarily excluded from logging operations during wireline logging. Generally, a layer of materials will exist between an outer surface of the logging instrument 10 and a wall of the wellbore 1. This layer is referred to as a "standoff layer," and includes a thickness, referred to as "standoff, S."

Generally, the logging instrument 10 is lowered into the wellbore 1 using a wireline 8 deployed by a derrick 6 or similar equipment. Generally, the wireline 8 includes suspension apparatus, such as a load bearing cable, as well as other apparatus. The other apparatus may include a power supply, a communications link (such as wired or optical) and other such equipment. Generally, the wireline 8 is conveyed from a service truck 9 or other similar apparatus (such as a service station, a base station, etc, . . . ). Often, the wireline 8 is coupled to topside equipment 7. The topside equipment 7 may provide power to the logging instrument 10, as well as provide computing and processing capabilities for at least one of control of operations and analysis of data.

Generally, the logging instrument 10 includes apparatus for performing measurements "downhole" or in the wellbore 1. Such apparatus include, for example, a variety of survey components 15. Exemplary survey components 15 may include radiation detectors, shielding, and the like. The components 15 may communicate with downhole electronics 13 as appropriate. The measurements and other sequences as may be performed using the logging instrument 10 are generally performed to ascertain and qualify a presence of hydrocarbons 5.

With regard to embodiments of survey components 15 disclosed herein, the components 15 may include at least one radiation detector. The radiation detector may include sub-components, such as a volume of a scintillation material, at least one photodetector, at least one preamplifier, a power supply, a data interface, a mounting apparatus and the like. One non-limiting embodiment of the photodetector is a photomultiplier tube.

As used herein, the term "gamma radiation detector," "radiation detector" and other related terms generally reference instruments that measure the gamma radiation entering the instrument 10. For example, the gamma radiation detector may use a scintillator material that interacts with gamma radiation and produces light photons which are in turn detected by a photodetector coupled to electronics. Exemplary gamma radiation detectors include, without limitation, sodium iodide (NaI), lanthanum bromides (LaBr$_3$), cesium iodide (CsI), bismuth germinate (BGO), and other organic crystals, inorganic crystals, plastics, solid state detectors, and combinations thereof.

Also as used herein, the term "characterization data" generally makes reference to a radiological profile (e.g., a gamma emission profile) of the formation 3. More specifically, the sub-surface materials will exhibit certain radiological characteristics. In various embodiments, these characteristics are a result of irradiation with gamma rays, X-rays, neutrons, or other types of radiation produced in the instrument 10, where the irradiation may ultimately result in scatter or emission of gamma rays in the formation 3 or these characteristics can be produced by radiation sources naturally occurring in the formation.

The term "detector geometry" relates to a configuration of the gamma radiation detector(s). The detector geometry may include a size and a shape of the scintillator material, a photodetector or any other component of a given radiation detector. An "aspect ratio" generally refers to one dimension of the radiation detector (such as a dimension of the scintillator material in relation to another dimension. For example, a cross section of the detector (taken along the x-axis and the y-axis) will exhibit a particular aspect ratio, which may be determined as a ratio of the x dimension to the y dimension. The term "placement geometry" relates to relative placement of a gamma radiation detector within the logging instrument or in relation to the surrounding volume. The term "logging while drilling" (LWD) relates to measuring parameters from the wellbore 1 while drilling is taking place.

Various types of interactions involve either absorption or emission of gamma radiation. Predominant types (as a function of increasing energy) include photoelectric effect, Compton scattering and pair production. As a matter of convention, "photoelectric effect" relates to interactions where electrons are emitted from matter after the absorption of a gamma ray. The emitted electrons may be referred to as "photoelectrons." The photoelectric effect may occur with photons having energy of about a few eV or higher. If a photon has sufficiently high energy, Compton scattering or pair production may occur. Generally, Compton scattering relates to a decrease in energy (increase in wavelength) of a gamma ray photon when the photon interacts with matter. In pair production, higher energy photons may interact with a target and cause an electron and a positron pair to be formed.

As discussed herein, detection of gamma photons may be sorted by a number of detection events according to energy. Accordingly, a distinct or distinguishable grouping of detection events may be referred to by terms such as a "line," a "peak" and by other such terms as are known in the art. It is recognized that such energy groups may not actually appear as a "line" on a spectral graph. That is, it is recognized that, for example, energy groupings are not always distinct, such as when considering one type of radiation detector in comparison to another. Accordingly, interpretation of the presence of an energy group is subject to various techniques for qualifying spectral data. As interpretation of spectral data is generally known in the art, this aspect is not discussed in greater detail herein, however, it should be recognized that aspects of spectral analysis may involve complicated and even subjective interpretation.

Figure 3:
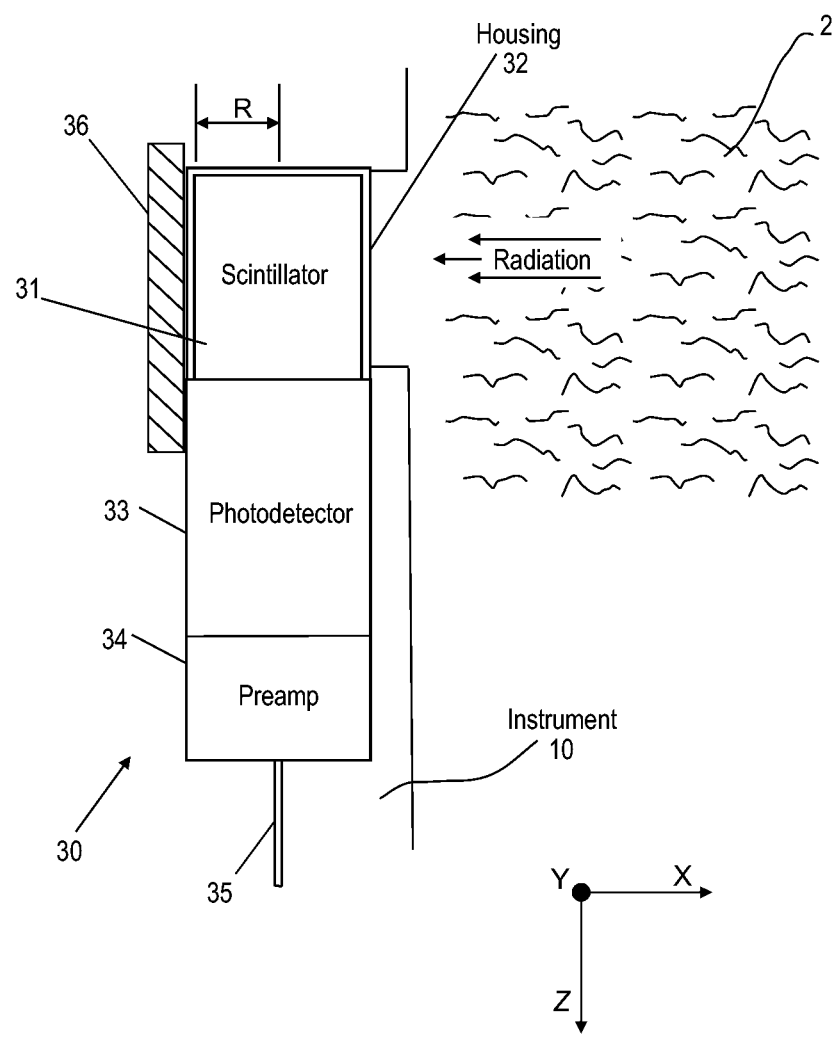
FIG. 3 depicts aspects of a well logging instrument that includes a pulsed neutron source and a plurality of spectral detectors.

Referring to FIG. 3, aspects of a radiation detector 30 mounted within the instrument 10 are shown. In this non-limiting example, the radiation detector 30 includes a material that is a scintillator 31. The scintillator 31 is cylindrical in shape, and characterized by a radius, R. The scintillator 31 is generally surrounded by a housing 32, which provides physical protection. The scintillator 31 is optically coupled to a photodetector 33 which receives pulses of light generated by the scintillator 31 as a result of radiation interactions within the scintillator 31. A preamplifier 34 amplifies signals from photodetector 33, which can be a photomultiplier tube (also referred to as a "PMT"). The preamplifier 34 provides output to the electronics unit 13 via an interface cable 35. Generally, the interface cable 35 also provides power to the radiation detector 30. In this example, shielding 36 is disposed about an inner portion of the radiation detector 30. The design and placement of the shielding 36 (such as lead or tungsten) is configured to eliminate or mitigate detection of radiation that is from a direction other than from the surrounding subsurface materials. Accordingly, the shielding 36 may at least partially surround the scintillator 31.

Figure 4A:
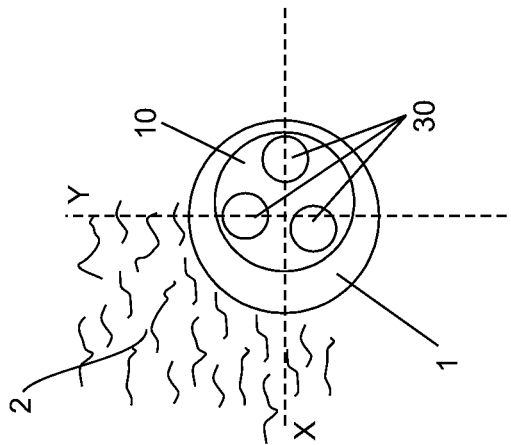
FIGS. 4A and 4B, collectively referred to herein as FIG. 4, illustrate radiation detectors in relation to the wellbore and a detection area for a wireline embodiment and a measuring while drilling embodiment, respectively.
Figure 4B:
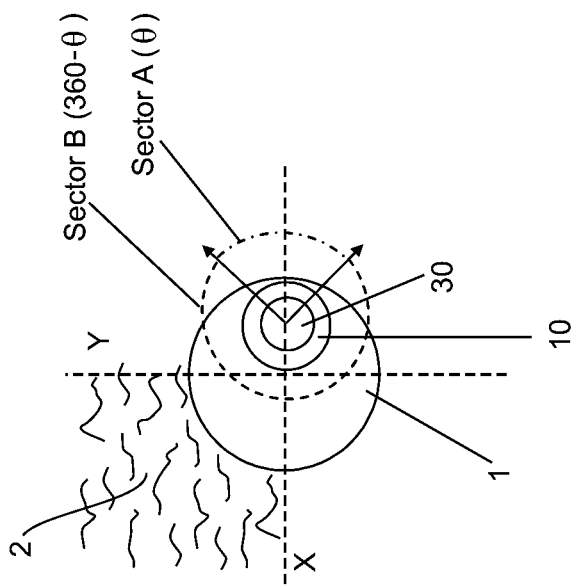

Referring now to FIG. 4, aspects of directional sensitivity of the radiation detector 30 are discussed. First, as noted with regard to FIG. 3, scintillator materials used in logging tools 10 for wireline and MWD applications generally involve scintillation crystals with cylindrical shapes. Often, a cylindrical shape is selected as the most convenient shape for the scintillator 31 as this provides for optical coupling with PMT and because such a shape provides cylindrical or axial symmetry of the detector response function and the independence of the detector sensitivity on an azimuth angle, θ.

The cylindrical symmetry of the detector response means that the probability of detecting gamma-rays does not depend on the azimuth direction. As a result, in the case of the logging tool for wireline logging (FIG. 4A) the measured gamma-ray spectrum contains both signals produced by the gamma-ray sources located in the formation 3 (Sector A) and in the wellbore 1 (Sector B). Accordingly, it should be considered that the gamma-ray signal obtained by the detector configuration of FIG. 4A includes a "borehole influence" (either through additional signal contribution or as a result of distortion of the formation signal by its attenuation in borehole). The distortion comes mainly from Sector B while Sector A provides more "clean" formation signal. In the case of the logging tool 10 configured for MWD, (FIG. 4B) the body of the logging tool 10 effectively shields the Sector B for each detector from gamma-rays carrying any formation signal.

The measured gamma-ray spectra which have minimal influence from the borehole generally provide users with more meaningful information (e.g., the concentrations of different elements in the formation obtained from such spectra generally have lower uncertainty due to decreased borehole influence). Accordingly, for wireline tools, a gamma-ray detector capable of measuring spectra with an azimuth angle dependent response function where response is low or substantially lower for Sector B than response for Sector A is desired.

Accordingly, aspects of design for the gamma-ray detector may consider various properties. Some of these aspects are introduced in a schematic illustration with an accompanying response function in FIG. 5. Properties that may be considered (designed around) may include, for example, the shielding 36 which would block gamma-rays coming from undesired directions and provide the detector collimation in particular direction (see FIG. 5A); a non-cylindrical shape of the scintillation crystal (see FIG. 5B); a sectional detector with an "anticoincidence" scheme of the pulse analysis detected in different sections may be employed (see FIG. 5C). These aspects, different combinations of these aspects, and other properties may be considered.

FIG. 5 (FIGS. 5A-5C) illustrates different approaches to design gamma-ray detectors with azimuth angle dependent response function based on: the use of the shield/collimator (a); controlling a shape of the scintillation crystal (e.g., providing a noncylindrical shape) (b); and use of sectioned detector to provide an "anticoincidence" scheme, where pulse analysis detected in different sections is separately analyzed and compared (c). In each of the examples, an approximate shape of an associated response function for each case is shown. In all cases, detector shape has mirror symmetry for the simplicity of the discussion. As a matter of convention, the term "Type A gamma-rays" ("γ ray A") relates to gamma-rays of interest (their directions correspond to the values of azimuth angle θ lying in the range of interest). The term "Type B gamma-rays" ("γ ray B") relates to gamma-rays which have a signal contribution that should be excluded from the measured spectrum (with directions corresponding to the azimuth angle values in the range).

Figure 6:
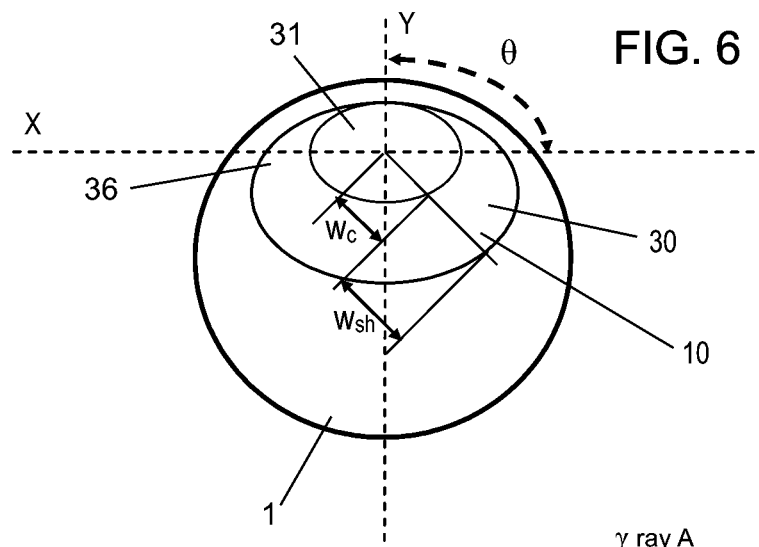
FIG. 6 depicts an embodiment of a radiation detector having azimuthal sensitivity.

Consider FIG. 5A in greater detail. This example illustrates the detector 30 with the shield around the scintillation crystal. In this example, the shield is made of the dense material and has thickness that allows it to adsorb most of the gamma-rays coming through it (Type B gamma-rays). The shield has an opening or window and as a result the Type A gamma-rays coming to the detector through it generally are not influenced by adsorption in the shield. The azimuth dependence of the detector response function is based on the variation of the gamma-ray adsorption in the shield with the azimuth angle, θ. Because the gamma-ray adsorption involves a statistical process, there is always at least some probability for gamma-ray to pass the shield either without interaction or with the energy value decreased by the Compton scattering. Therefore, the value of the response function is always above zero (0) for any value of the azimuth angle, θ, and depends on, among other things, the gamma-ray attenuation properties of the shield material and shield thickness. One dense material suited for use is tungsten ($\rho=19.25$ g/cm$^3$) which exhibits an attenuation length for gamma-rays with an energy of 3 MeV (total scattering cross section ($\sigma_{total}$) is close to the minimal value at this energy value) is equal to $L_r=1.28$ cm. In this example, the shield thickness that would provide attenuation of about 90% of the gamma-rays is equal to 2.8 cm and for 95% attenuation, the thickness is about 3.9 cm. It is also should be pointed out that because $\sigma_{total}(hv)\neq const$ in the energy range of interest (from about 0.1 MeV to about 10 MeV), the intensity of the borehole signal passing through the shield and present in the measured spectrum will depend on the gamma-ray energy. Taking into consideration the limited amount of space available inside of a wireline tool for the detector, as well as the geometry of the measurements providing the different amount of the borehole signal coming from different directions due to the dependence of the thickness of the borehole fluid layer on azimuth angle, θ, a cross-sectional shape of the detector crystal and the shield which would provide a balance between detection efficiency (the volume of the scintillation crystal) and attenuation of the borehole signal (the thickness of the shield). An example of a resulting embodiment is depicted in FIG. 6, where both crystal thickness, $w_c$, and shield azimuth thickness, $w_{sh}$, depend on the azimuth angle, θ. In this case, the scintillation crystal has a generally noncylindrical shape (in this example, the shape of the crystal horizontal cross section is elliptical). Among other things, this shape accommodates economic use of the available space inside of the tool.

Referring again to FIG. 5B, illustrated therein are aspects of an embodiment of the scintillation crystal with a noncylindrical shape. A probability of interaction with the media (i.e., a probability of energy deposition in the crystal) for the gamma-ray is defined by:

$$\rho \sim 1-\exp(-x/L_\gamma) \quad (1);$$

where x represents a length of the gamma-ray path in the media. In the case of the noncylindrical crystal shape detector, gamma-rays coming from different azimuth directions encounter different thicknesses of the scintillation material. As a result, the probability a gamma-ray A interaction in the detector is higher than the probability of a gamma-ray B interaction. That is, as shown in FIG. 5B, $x_A > x_B$. It should be noted that in the first order approximation, which does not take into consideration multiple scattering events, dependence is symmetrical relatively to $\theta=\pi/2(R(\theta)=R(\pi-\theta))$. It may be assumed, at least in part, that scattering of gamma-rays do not depends on its direction for this embodiment.

There are several types of interactions which can cause the deposition of some up to all of the energy associated with a gamma-ray in the scintillation material. For example, for a gamma-ray with a relatively high energy, one or two pair production events may occur. In addition, several Compton scattering events may also occur and decrease the energy up to the point when a photoelectric adsorption interaction could take place. Each of the interaction events decreases the energy of gamma-ray by some value $\Delta hv_i$, creates its own "hot" electron and in the case of such scenario the detected burst of light will be formed by the visible photons emitted during relaxations of all "hot" electrons created inside of the crystal. The gamma-ray interaction and "hot" electron relaxation processes are much faster than the visible light emission in the process of the low energy electron relaxation, so all different interactions created the same gamma-ray "contribute" signal into the same pulse detected by PMT.

In the case of the multistep scenario of the gamma-ray interaction with scintillator there is nonzero probability that gamma-ray leaves the scintillation crystal before all its energy is deposited. In this case instead the pulse corresponding to hv energy the pulse corresponding to $\Sigma\Delta hv_i < hv$ is detected where $\Delta hv_i$ is the energy deposited to the crystal after $i_{th}$ interaction of gamma-ray. As a result the measured spectrum of the monochromatic gamma-ray flux except photopeak corresponding to gamma-ray energy hv contains intensity corresponding to gamma-ray energies smaller than hv. The nonphotopeak intensity distorts the spectral shape and makes its interpretation and quantitative analysis difficult (the nonphotopeak intensity does not allow to determine the intensities of the photopeaks with high precision and plays a role of the background for the useful photopeak signal). Ratio between photopeak intensity $I_{ph}$ and intensity at energies less than hv, noted as $I_{CT}$, is defined by the effective thickness of the scintillation material to interact with and increases with thickness increase (the probability of all gamma-ray energy deposition increases with the possible gamma-ray path increase according to Eq. (1) above).

Figure 7A:
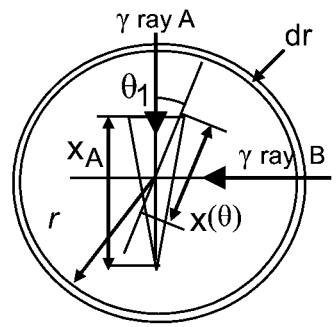
FIGS. 7A and 7B, collectively referred to herein as FIG. 7, illustrates aspects of a model system of thin shell of radius r with the sources of gamma-rays with energy hv.
Figure 7B:
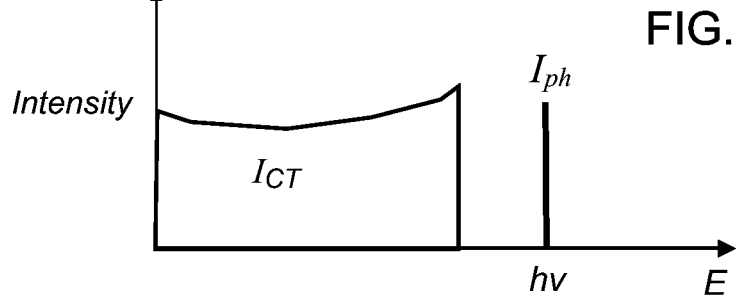

Referring now to FIG. 7, in this example, when the noncylindrical detector locates in the center of a thin shell of radius r (where $r \gg x_A$) with the thin shell containing the sources of gamma-rays of energy hv, the photopeak intensity, $I_{ph}$, is defined by:

$$I_{ph} = I_0 \int_0^{2\pi} (1-\exp(-x(\theta)/L_\gamma))d\theta; \quad (2)$$

where $x(\theta)$ represents the path of the gamma-ray coming from azimuth direction, θ, in the crystal. Because value of $x(\theta)$ is much higher for $\theta \in (\theta_1, -\theta_1) \cup (\pi-\theta_1, \pi+\theta_1)$ than for the rest of the azimuth angle values, the main contribution to the photopeak intensity, $I_{ph}$, is provided by gamma-rays coming from directions in $\theta \in (\theta_1, -\theta_1) \cup (\pi-\theta_1, \pi+\theta_1)$ range. The same conclusion can not be made for the signal detected at energies below hv. The intensity of this "tail", ($I_{CT}$) could have the comparable contribution from gamma-rays coming from all possible direction and the dependence of $I_{CT}'(\theta)$ on the azimuth angle θ should be defined from the Monte-Carlo modeling results, where a "specific" azimuth angle "tail" intensity, may be described by Eq. (3):

$$I_{CT} = \int_0^{2\pi} I'_{CT}(\theta) d\theta. \quad (3)$$

The described above problem of the presence in the spectrum of the strong "noncollimated" background signal, $I_{CT}$, and its interference with "collimated" signal in photopeaks may be decreased, and, at least in some instances, effectively eliminated by using a sectional detector design provided in FIG. 8.

Figure 8A:
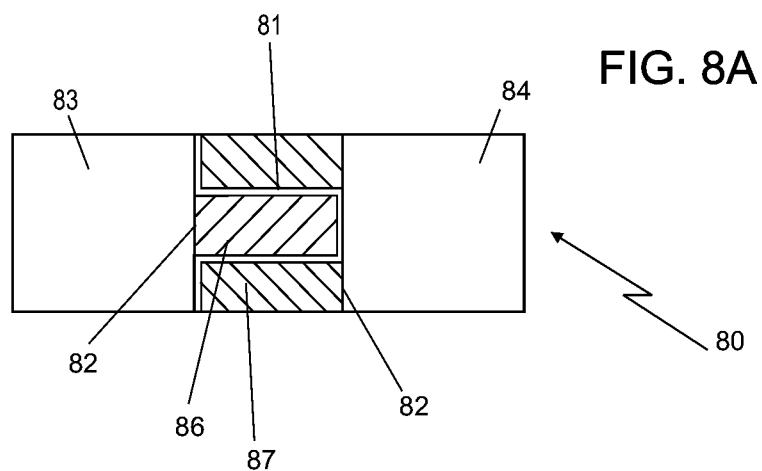
FIGS. 8A and 8B, collectively referred to herein as FIG. 8, illustrates an exemplary design for a sectioned detector.
Figure 8B:
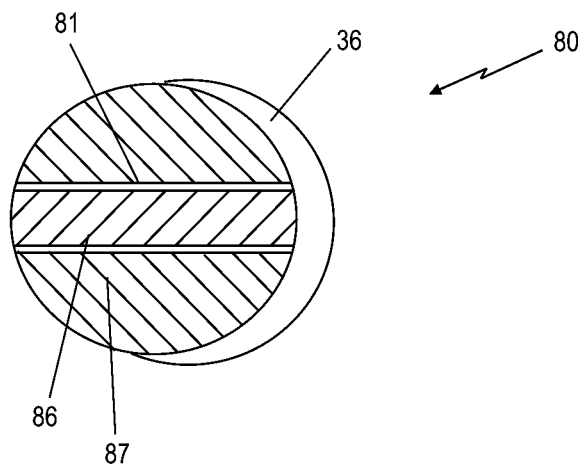

Referring to FIG. 8, the sectional detector design generally uses an "anticoincidence" scheme for the pulse analysis detected in different detector sections. In these embodiments, the detector includes several separate scintillator sections. As shown by the side-view presented in FIG. 8A, the sectioned (or "sectional") radiation detector 80. In this example, the sectioned radiation detector 80 includes a first scintillator (scintillator A—86) and a second scintillator (scintillator B—87). It should be recognized that more scintillators may be employed as deemed appropriate. Separating the various scintillators 86, 87 is a reflective coating 81. The reflective coating 81 may be any material that will provide for optical separation of light events within each of the respective scintillators. Examples include polished metals, such as aluminum, polymers such as Teflon, and different oxides and may be distributed in a thin coating such as to have a negligible effect on radiation attenuation. At appropriate points, in this case on opposite ends, each of the scintillators 86, 87 is coupled to a respective photodetector 83, 84, such as a photomultiplier tube (PMT). A top-down cross-sectional view is provided in FIG. 8B, which also includes shielding about a portion of the sectioned radiation detector 80.

In general, the diameter of the PMT or other photodetector for Scintillator A should be large enough to provide the coverage of the whole Scintillator A area or special optical coupler should be used. For Scintillator B a photodiode "parquet" can be used as a photodetector.

While described in the embodiment provided in FIG. 8, it should be recognized that any of a variety of configurations may be used. That is, and by way of non-limiting example, the first detector may completely surround the second detector. The first detector may partially surround the second detector. The first detector may be disposed proximate to and in contact with the second detector (separated only by the reflective coating or reflective material). The associated photodetectors may be disposed as determined appropriate. With the use of additional detectors, additional geometries may be realized, all of which are contemplated by the teachings herein.

Given a sectioned radiation detector 80 configured according to the embodiment shown, the following scenarios of the Type A and Type B gamma-ray interactions are possible:

1. Gamma-ray A deposits all its energy, hv, in the Scintillator A ($\Delta hv_{AA}$=hv and $\Delta hv_{AB}$=0);
2. Gamma-ray A deposits part of its energy, hv, in the Scintillator A and no energy is deposited in Scintillator B ($\Delta hv_{AA}$<hv and $\Delta hv_{AB}$=0);
3. Gamma-ray A deposits part of it energy, hv, in the Scintillator A and part of its energy in Scintillator B ($\Delta hv_{AA}$<hv and $\Delta hv_{AB}$<hv);
4. Gamma-ray A deposits no energy in Scintillator A and part of its energy or all energy is deposited in Scintillator B ($\Delta hv_{AA}$=0 and $\Delta hv_{AB}$≦hv);
5. Gamma-ray B deposits all or part of its energy, hv, in Scintillator B and no energy is deposited in Scintillator A ($\Delta hv_{AA}$=0 and $\Delta hv_{BB}$≦hv);
6. Gamma-ray B deposits part of its energy, hv, in Scintillator B and part of its energy in scintillator A ($\Delta hv_{AA}$<hv and $\Delta hv_{BB}$<hv);
7. Gamma-ray B deposits part of its energy, hv, or all energy in Scintillator A and no energy is deposited in Scintillator B ($\Delta hv_{AA}$≦hv and $\Delta hv_{BB}$=0).

Figure 9:
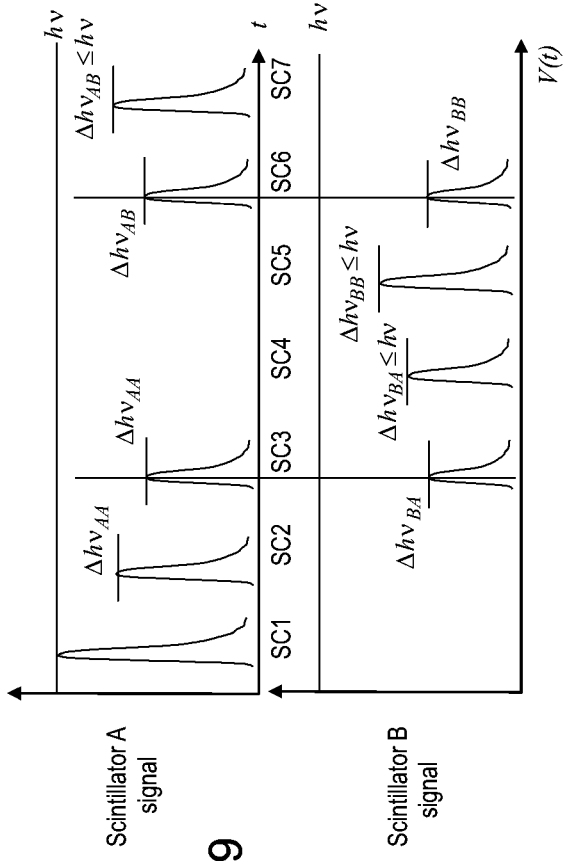
FIG. 9 depicts spectra associated with possible scenarios for gamma-ray interactions with the detector and how they are observed in the pulse signals coming from Scintillator A and Scintillator B.

FIG. 9 illustrates how these scenarios (SC1 to SC7) are reflected in the pulse signals coming from the Scintillator A and Scintillator B portions of the sectioned radiation detector 80. To obtain a spectrum, which would have high photopeak intensity $I_{ph}$ and low intensity of the background $I_{CT}$ the probability of SC1 events should be maximized while the probabilities of SC2, SC3, SC6 and SC7 events should be minimized. Alternatively, the pulses corresponding to these scenarios from the Scintillator A signal should be excluded (events corresponding to SC4 and SC5 happen in Scintillator B only and do not contribute to the Scintillator A signal). From FIG. 9, it may be seen that pulses formed in the case of SC3 and SC6 events can be excluded from the Scintillator A signal by comparing it with the signal of Scintillator B. If pulses in Scintillator A and Scintillator B signals coincide in time, a Scintillator A pulse should be excluded because it was created in the result of the gamma-ray interaction with the detector according to SC3 and SC6 scenarios. This scheme of analysis of the pulse signals coming from different channels is known as "anticoincidence" analysis. In the case of the sectional radiation detector 80, use of anticoincidence counting allows users to exclude pulses formed in the case of SC3 and SC6 events.

The probability of the SC2 and SC7 events can be minimized through the maximization of the gamma-ray interaction probability with Scintillator B through its gamma-ray attenuation property maximization. This can be achieved either by using the Scintillator B shape providing increased effective gamma-ray path length inside of this part of the detector for most of the θ values or by using scintillation material with higher density or by both techniques. The geometrical shape of Scintillator B may be designed using results of Monte-Carlo based modeling.

It should be noted that, in some embodiments, the pulse signal from Scintillator B is used only to "clean" the Scintillator A signal from SC3 and SC6 pulses and there is no need for the high precision of the Scintillator B signal pulse amplitude measurement. That is, users generally need to be able to identify the presence of the pulse at time, t, in the signal but do not need to know an amplitude value with a high degree of precision. As a result, material of Scintillator B may be different from the material of Scintillator A. Scintillator B, for example, may be high density and low resolution scintillation material, such as, for example $CdWO_4$ or BGO, and selected to function independently of the operation temperature (temperature influences on the light yield and as a result on the resolution of the measured spectra in the case of BGO) may be used for Scintillator B. Instead of a PMT, a photodiode may be used as a photodetector successfully for Scintillator B.

To provide an example having greater detail, in one embodiment, the detector includes the scintillator, two photomultiplier tubes (PMT) or diodes, preamplifiers, a fast two channel analog to digital converter (ADC) and a two channel signal processor. The scincillator includes two crystals, with one inserted into the other. The larger (outer) crystal is made from BGO material and has the cylindrical shape and the cylindrical through channel coaxial to the main axis. The smaller (inner) crystal is made of $LaBr_3(Ce)$ material, has cylindrical shape with the outer diameter equal to the inner diameter of the outer crystal channel and the same length as the length of outer crystal and it is inserted into the outer BGO crystal. The outer and inner crystals are optically isolated from each other. The photomultiplier tubes (PMT) are optically coupled to the opposite butt-ends of the scintillator in such a way that one PMT collects light only from outer crystal and the other PMT collects light from the inner crystal.

The BGO material has higher density than LaBr$_3$(Ce) does, and as a result, the BGO detector has a higher detection efficiency. The LaBr$_3$(Ce) material has much lower decay time and better resolution in the case of low energy gamma rays. In some embodiments, the resulting gamma spectrum contains much more lines in the low energy part of the spectrum, which provides for high quality data analysis. The high energy part of the spectrum contains fewer peaks and, as a result (due to smaller peak overlay) the statistic and resolution is not so important for the spectrum analysis and spectrum deconvolution. By processing the spectra measured by outer and inner crystals separately the quality of the overall analysis can be improved.

As noted below and elsewhere herein, the exact configuration of the scintillator may be optimized using Monte-Carlo simulations for managing performance. The simulations may consider user requirements, such as which parts of the energy range has to posses the best resolution/statistics. For example, performance will be better if the outer crystal is made of LaBr$_3$(Ce) and inner crystal is BGO. However, a problem is that LaBr$_3$(Ce) is much more expensive than BGO, so to limit cost of the system, the reverse configuration of scintillator may be used.

Another performance improvement involves use of coincident event analysis, which is applied to the signals collected from outer and inner crystals. As mentioned above, the LaBr$_3$(Ce) decay time is about 20 ns, while the BGO decay time is about 300 ns. The decay time parameter defines the dead time (maximum count rate) for the monolithic detector. In this embodiment, the detector dead time is equal to the dead time of one of the crystals that is the greater of the two outer and inner crystals. To make the dead time of the BGO crystal smaller, a fully digital signal processing system may be used. After preamplification, the PMT signal is digitized by the fast A/D converter (sampling rate>100 MHz, resolution>4096 channels) and the obtained digital signal is processed by a FPGA based processor. If the shape of the pulse produced by the PMT of the BGO crystal is known, the on-line digital deconvolution of the signal can be performed. As a result the pulses can be resolved even in the case of the large neighbor pulse overlay and the efficient dead time of the detector can be decreased below the decay time of BGO material. The signal processing (deconvolution) algorithm depends on the pulse shape and should be selected for the best performance of the detector. The same processor may be used to perform the coincidence event analysis of the signals from outer and inner crystals.

Referring again to FIG. 5, it should be noted that R(E,E',θ) is symmetrical relative to θ=π/2 (see FIGS. 5B, 5C) because the effective path of the gamma-ray in the detector is independent on the direction of the gamma-ray. As a result both for the non-cylindrical radiation detector (FIG. 6) and sectioned radiation detector (FIG. 8) some shielding may be necessary to "screen" the θ∈(π−θ$_1$,π+θ$_1$) sector from the gamma-rays coming from the directions in this range of azimuth angle (see FIG. 7A). The exact shape of this shield may be designed using results of the Monte-Carlo modeling.

In the case of the LWD measurements, the gamma-ray detector with a "focused" or "collimated" response function may be used to perform the gamma-ray spectra measurements suitable to build images of the borehole. Detectors with a narrowly collimated response function may be used to build images both in the case of the natural gamma spectral measurements and prompt and capture gamma spectral measurements. It should be noted that in the case of LWD measurements from one side, it is easier to provide the azimuth angle dependence for R(E,E',θ), as the tool housing plays a role of an efficient shield but from other side it is more difficult because of less available space inside of the tool for the scintillation material (as a result the efficiency of the detector could be low). Also, in some embodiments of the LWD detector, the angular "width" of the detector R(E,E',θ) (the range of θ values where R(θ)≠0) should be no more than $$\frac{2\pi}{12}$$

to provide at least 12 sectors or points in the image. In some embodiments of detectors for wireline measurements, the main goal of a collimated response function is to reduce contamination of the measured spectrum with radiation from the borehole. The detector collimation is used to limit a gamma-ray collection area to the formation. In this case, the angular "width" of R(E,E',θ) can be as large as $$\frac{2\pi}{4}$$

or more depending on ratio between borehole and tool diameters.

Having thus described aspects of downhole radiation detectors having azimuthal (i.e., directional) sensitivity, additional aspects for providing improved designs are provided. In this section, certain additional terms or conventions are presented for purposes of discussion. Of course, such terms are not intended to be limiting, and are generally provided for purposes of describing a method to improve the design of the scintillation gamma ray detector with azimuthal dependence described by the response function.

Accordingly, in review, a gamma-ray with energy hν interacts with scintillation material causing an appearance of a "hot" electron which initially possesses energy equal to $E_{he}=\alpha h\nu$ where $0<\alpha<1$ but $E_{he}>>>E_b$ (band gap of the scintillator), (this is referred to as a "tr1 stage"). The "hot" electron is converted into many (thousands) low energy electrons in the conduction band of the scintillator ($E_{le}\sim E_b$) through mainly Auger processes (tr2 stage). The relaxation of these low energy electrons happens with the emission of the visible light photons ($E_{ph}\sim E_b$) (tr3 stage). The light emitted as a result of the gamma-ray interaction with the scintillation material is collected (tr4 stage) at a cathode of the photomultiplier tube (PMT). The PMT converts the signal associated with each photon into a cascade of electrons and the photon-to-electron conversion process is defined by multiplication coefficient β (the number of electrons formed from single photon interaction). Each electron cascade created by the collected photons constitute to the electric charge Q formed at PMT anode (tr5 stage) and detected in the form of electric pulse (tr6 stage) with general shape $$V(Q, \tau, t) = \frac{1}{\lambda - \theta} \frac{\lambda Q}{C} (e^{-(t-\tau)/\theta} - e^{-(t-\tau)/\lambda})$$

where λ is the decay constant of the PMT anode signal $$\left(I(t) = I_0 e^{-\lambda t} \text{ and } Q = \int_0^\infty I_0 e^{-\lambda t} dI\right)$$

which is defined by the decay time of scintillation material, C and R are the capacitance and resistance of the parallel circuit which is equivalent to PMT, $$\theta = \frac{1}{RC}.$$

The pulse amplitude $$A = \frac{1}{\lambda - \theta} \frac{\lambda Q}{C}$$

is assumed to be proportional to the energy hv of detected gamma-ray.

Figure 10:
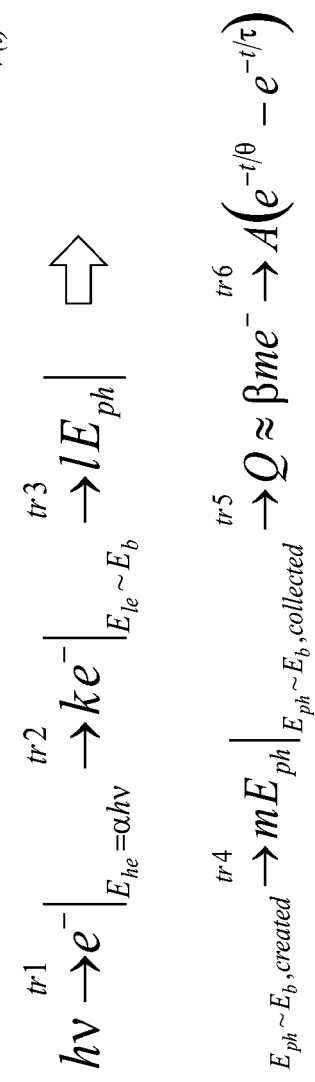
FIG. 10 is a notation showing the various stages of radiation detection using a scintillation detector.

FIG. 10 describes these various stages in a notational format. From FIG. 10, it may be seen that several physical processes are involved into the gamma-ray detection. These processes and related conversion coefficients (a, k, l, m etc) depend on different properties of the scintillation material.

The stage identified as the "tr1 stage" is defined by the efficiency of the detector (the ability of the detector to deposit the energy of gamma-ray inside of scintillation crystal). The detector efficiency is, in turn, defined by the shape of the scintillation crystal and the gamma-ray stopping power of the scintillation material $$L_\gamma(h\nu) = \sum_i \sigma^i(h\nu) n_{at}^i \text{ where } \sigma^i(h\nu)$$

is the crossection of the corresponding gamma-ray interaction with electrons of $i_{th}$ element atom constituting the scintillation material. In the first approximation, it is assumed that the crossection of the corresponding gamma-ray interaction with electrons of $i_{th}$ element atom is equivalent to the atomic number or number of electrons in the atom ($\sigma^i(h\nu) \sim Z$), which is equivalent to the assumption that $L_\gamma(h\nu) \sim \rho$ (scintillation material density). It is noted that the "stopping power" defines the probability of the gamma-ray interaction with the material on the way through the slab of material of thickness $dx dI/I = -dx/L_\gamma$. For a slab with thickness x, it is more convenient to use the ratio between the fluxes of gamma-rays at the slab input $I_{in}$ and after the slab (at the slab output)

$$I_{out} \text{ and } \frac{I_{out}}{I_{in}} = \exp\left(-\frac{x}{L_\gamma}\right).$$

So, for the detectors with same shapes but made of different scintillation materials, higher efficiency will be provided by the scintillator with higher density. It should be noted that the tr1 stage of the scintillation process is statistical by its nature and the values of coefficient α are distributed between 1 and 0 according to R(hv,E'), the detector response function.

The tr2 and tr3 stages are defined by the scintillation material light yield, LY. This parameter characterizes how many photons of visible light are generated as a result of the gamma-ray interaction with the scintillation material per keV of the gamma-ray energy deposited in the scintillation crystal. The light yield, LY, of the scintillator determines the resolution of the measured spectrum because of the statistical nature of this process. The gamma-rays with energy hv are converted into the burst of light with the average number of visible light photons in the burst equal to $n_{ph}$=hv[keV]·LY. Generally $n_{ph}$ has a Gaussian distribution with dispersion equal to $\sigma_{ph}=\sqrt{h\nu[keV] \cdot LY}$.

The tr4 stage depends on the detector optical structure and its ability to collect the light at PMT cathode. The light collection efficiency is defined by the detector geometry, the detector material light adsorption coefficient, the reflection coefficient of the detector surface and quality (adsorption and scattering properties) of the optical contact between PMT window and the crystal. In general case it can be characterized by the probability to collect particular portion α of the light emitted in the light burst ρ(α) where 0<α<1 and $$\alpha = \frac{I_{collected}}{I_{emitted}} \cdot \rho(\alpha)$$

can be found from equations $\alpha = f_f(r)$ and $\rho = f_\gamma(r)$ where $f_f(r)$ defines the light collection properties of the detector (the dependence on the amount of the collected light from burst on the location r of the burst inside of the detector) and $f_\gamma(r)$ is the probability of the light burst (gamma-ray interaction with scintillation material) to happen in the point r.

The tr5 stage is defined by the capability of the PMT to convert the incoming visible light photon into the cascade of electrons at PMT anode. This stage includes visible photon conversion into photoelectrons at the PMT cathode and multiplication of the photoelectron. The photon to photoelectron conversion is defined by the cathode material and its thickness and the photon energy. This process is, in turn, characterized by the PMT quantum efficiency Q (the ratio between outcoming photoelectrons and incoming photons) which is equal to ~0.25 for typical PMT. The electron multiplication process is determined by the number of dynodes and acceleration voltage and characterized by the gain G (the number of the electrons at the anode born by one photoelectron) which is equal to ~$10^5$-$10^6$.

So the detector resolution $$\frac{\Delta h\nu}{h\nu}$$

(or the relative error in the measurement of the gamma-ray energy) at gamma-ray energy hv is determined by the relative errors of the transformations at tr2-tr5 stages which are defined by the dispersions of the corresponding processes.

$$\frac{\Delta h\nu}{h\nu}$$

is described by Eq. (4):

$$\frac{\Delta h\nu}{h\nu} = \sqrt{\left(\frac{\sigma'_{ph}}{n'_{ph}}\right)^2 + \left(\frac{\sigma_\rho}{\alpha_{av}}\right)^2 + \left(\frac{\sigma_{PMT}}{G}\right)^2} \quad (4)$$

$$= \ldots$$

$$= \sqrt{\frac{1}{Q \cdot \alpha_{av} h\nu[keV] \cdot LY} + \left(\frac{\sigma_\rho}{\alpha_{av}}\right)^2 + \left(\frac{1}{\sqrt{G}}\right)^2} \ ;$$

where $\alpha_{av}$ represents an average value of $$\alpha = \frac{I_{collected}}{I_{emitted}}$$

defined by $\pi(\alpha)$ distribution, $\sigma_\rho$ represents a dispersion of $\rho(\alpha)$, and $$\sigma_{PMT} = \frac{1}{\sqrt{G}},$$

$n'_{ph} = Q \cdot \alpha_{av} \cdot h\nu[keV] \cdot LY$ (the average number of the photoelectrons "kicked" out of PMT cathode by the light burst) and $\sigma'_{ph} = \sqrt{n'_{ph}}$.

For almost any modern PMT tube, the $$\frac{1}{\sqrt{G}}$$

contribution into the overall resolution can be ignored because $G \sim 10^5 \text{-} 10^6$ and $$\frac{1}{\sqrt{G}}$$

<0.1%. Q is defined by the PMT design and it is ~0.25 (for common embodiments of PMT's). hv[keV]·LY is defined by the internal properties of the scintillation material (for NaI (Tl), LY=38; for CsI(Tl), LY=54; for BGO, LY=8-10; for LnBr$_3$(Ce), LY=63; for (Lu—Y)AlO$_3$(Ce), LY~12-16). So the rest of the resolution $$\frac{\Delta h\nu}{h\nu}$$

is generally made up of the contribution coming from $\rho(\alpha)$. In the case of the scintillation detector with the cylindrical shape of the crystal, a PMT with s matched diameter, minimal number of optical interfaces and "high quality" optical contact between PMT and crystal typically the total contribution of $\rho(\alpha)$ to the resolution is of the order of $$0.5 \cdot \frac{1}{\sqrt{Q \cdot h\nu[keV] \cdot LY}} \text{ to } \frac{1}{\sqrt{Q \cdot h\nu[keV] \cdot LY}}$$

depending on the crystal aspect ratio and visible light adsorption coefficient of the scintillator.

The noncylindrical shape of the scintillation crystal provides new properties to the detector responses function. For example it can be made "collimated" (R(E,E',θ) is higher for some values of azimuth angle, θ, than for another ones). At the same time the light collection at the PMT window is less optimal inside of the noncylindrical volume than inside of the cylindrical one due to light ray paths with more complicated trajectories. As a result, $\rho(\alpha)$ is broader ($\sigma_\rho$ is larger) for the crystal with noncylindrical shape. This causes the deterioration of the spectral resolution $$\frac{\Delta h\nu}{h\nu}$$

of the detector which uses the scintillator with noncylindrical shape. Another complexity of the design involving noncylindrical scintillator is related to its optical coupling with PMT which can be done either by using PMT with the diameter larger than any crystal window dimension (PMT circle covers the window completely) or by using special optical coupler (the transparent optical element with the reflective coating connecting small diameter PMT and crystal window by providing the light path) which would also influence the detector resolution $$\frac{\Delta h\nu}{h\nu}.$$

Based on the consideration presented above, it may be concluded that design of the shape of the gamma-ray detector scintillation crystal should be an iterative process, where for each iteration the following calculations may be performed: Stage 1, the suggested shape is analyzed from the gamma-ray interaction point of using Monte-Carlo modeling techniques and $\rho = f_\gamma(r)$ and R(E,E',θ) are calculated; in Stage 2, the suggested shape including the PMT optical coupling element may be analyzed from the light collection properties point of view using Monte-Carlo based ray tracing and $\alpha = f_l(r)$ is calculated; and at Stage 3, the $\rho(\alpha)$ and $$\frac{\Delta h\nu}{h\nu}$$

may be calculated.

Based on the obtained results (R(E,E',θ) and $$\left.\frac{\Delta h\nu}{h\nu}\right)$$

the shape of the crystal could be modified and calculations of R(E,E',θ) and $$\frac{\Delta h\nu}{h\nu}$$

could be repeated.

In summary, conceptual designs of scintillation gamma ray detectors with the collimated response function based on different principles of collimation (shielding, noncylindrical shape of the scintillator and use of the two body or multibody detector with the coincidence detection scheme) are disclosed herein. Such detectors exhibit varying sensitivity to the gamma rays arriving from the directions with azimuth angle values in the narrow range. In the case of wireline nuclear tools, the use of collimated detectors will users allow to exclude borehole signal from measured gamma ray spectra. In the case of LWD tools, the use of collimated detectors will provide imaging capabilities based on the detection of gamma ray signals (induced by neutrons, scatter or by natural emissions).

Definitions of certain terms discussed herein are provided for convenience. These definitions are not meant to be limiting or exhaustive of usage herein, and are generally provided as guidance and perspective. As used herein, the term "carrier" as used herein generally refers to any device, device component, combination of devices, media and/or member that may be used to convey, house, support or otherwise facilitate the use of another device, device component, combination of devices, media and/or member. Exemplary non-limiting carriers include drill strings of the coiled tube type, of the jointed pipe type and any combination or portion thereof. Other carrier examples include casing pipes, wirelines, wireline sondes, slickline sondes, drop shots, downhole subs, BHA's, drill string inserts, modules, internal housings and substrate portions thereof. An information "processing device" as used herein means any device that transmits, receives, manipulates, converts, calculates, modulates, transposes, carries, stores or otherwise uses information. In several non-limiting aspects of the disclosure, an information processing device includes a computer that executes programmed instructions for performing various methods. "Electromagnetic information" includes, but is not limited to, one or more or any combination of analog signals, digital signals, recorded data, data structures, database information, parameters relating to surface or downhole equipment and/or environment, and/or formations.

In support of the teachings herein, various analysis components may be used, including a digital system and/or an analog system. The system(s) may have components such as a processor, storage media, memory, input, output, communications link (wired, wireless, pulsed mud, optical or other), user interfaces, software and firmware programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A radiation detector for performing measurements downhole in a wellbore, the detector comprising:
   a plurality of radiation scintillators, each scintillator in the plurality comprising a shape that is configured to provide azimuthal sensitivity relative to the wellbore for detection of radiation downhole, wherein each scintillator in the plurality comprises an optical coupling to a respective photodetector that receives a pulse signal due to detection of a gamma ray in the respective scintillator; and
   a processor configured to receive pulse signals from each respective photodetector and to provide anticoincidence counting that excludes redundant pulse signals received due to the same gamma ray being detected in two or more scintillators in the plurality.

2. The radiation detector as in claim 1, wherein the shape is a non-cylindrical shape.

3. The radiation detector as in claim 1, further comprising shielding disposed about at least a portion of the plurality of radiation scintillators.

4. The radiation detector as in claim 1, wherein a response of a scintillator in the plurality is substantially higher for radiation emitted in a formation in a direction of interest than for radiation emitted in or about the wellbore.

5. The radiation detector as in claim 1, wherein a thickness for at least one of a scintillator in the plurality, $w_c$, and a shield, $w_{sh}$, is selected according to an azimuth angle, $\theta$.

6. The radiation detector as in claim 1, wherein each scintillator in the plurality is separated by a reflective material disposed there between.

7. The radiation detector as in claim 1, wherein each the shape for the scintillator is determined according to a Monte-Carlo modeling technique.

8. A method for fabricating a radiation detector for performing a measurement downhole in a wellbore, the detector comprising:
   selecting a radiation scintillator material for shaping as a radiation detector having a plurality of radiation scintillators;
   determining an optimal shape of each radiation scintillator in the plurality that is configured to provide azimuthal sensitivity relative to the wellbore for detection of radiation downhole;

shaping the material to the optimal shape for each scintillator in the plurality to provide the azimuthal sensitivity relative to the wellbore for detection of radiation downhole;

optically coupling each scintillator in the plurality to a respective photodetector that receives a pulse signal due to detection of a gamma ray in the respective scintillator; and coupling a processor to each respective photodetector, the processor being configured to provide anticoincidence counting that excludes redundant pulse signals received due to the same gamma ray being detected in two or more scintillators in the plurality.

9. The method as in claim 8, wherein the material selected comprises at least one of sodium iodide (NaI), lanthanum bromide ($LaBr_3$), cesium iodide (CsI), bismuth germinate (BGO), an organic crystal, an inorganic crystal and a combination of any of the foregoing.

10. The method as in claim 8, further comprising determining the shape according to at least one of an attenuation coefficient of the material, a stopping power of the material, an energy of radiation of interest and a geometry of a downhole instrument adapted for carrying the radiation detector.

11. The method as in claim 8, further comprising disposing a reflective material between the material and another radiation scintillator material.

12. The method as in claim 8, wherein the respective photodetectors comprises one of a photomultiplier tube and a photodiode.

13. The method as in claim 8, further comprising disposing shielding about at least a portion of the radiation detector.

14. A non-transitory computer readable medium comprising computer executable instructions for evaluating signals from a plurality of radiation detectors, the instructions implementing a method comprising:

receiving a plurality of detection events from each scintillator of a radiation detector comprising a plurality of radiation scintillators, each scintillator comprising a shape that is configured for the radiation detector to provide azimuthal sensitivity relative to the wellbore for detection of radiation downhole;

at least one of excluding and combining selected ones of the radiation detection events from an output to provide an adjusted output; and providing the adjusted output to a user;

wherein the excluding comprises performing an anticoincidence analysis.

15. The non-transitory computer readable medium as in claim 14, further comprising performing a pulse height analysis for each of the radiation detection events.

* * * * *